(12) United States Patent
Hofmann

(10) Patent No.: US 8,459,563 B2
(45) Date of Patent: Jun. 11, 2013

(54) CIRCUIT BOARD WITH INTEGRATED RFID MICROCHIP

(75) Inventor: Arne Hofmann, Wiesbaden (DE)

(73) Assignee: Beta Layout GmbH, Aarbergen (DE)

( * ) Notice: Subject to any disclaimer, the term of this patent is extended or adjusted under 35 U.S.C. 154(b) by 0 days.

(21) Appl. No.: 13/283,360

(22) Filed: Oct. 27, 2011

(65) Prior Publication Data

US 2012/0104104 A1    May 3, 2012

(30) Foreign Application Priority Data

Oct. 28, 2010  (DE) .......................... 20 2010 014 862

(51) Int. Cl.
G06K 19/06    (2006.01)
(52) U.S. Cl.
USPC ......................................... 235/492; 235/487
(58) Field of Classification Search
USPC ................... 235/375, 380, 487, 492, 441
See application file for complete search history.

(56) References Cited

U.S. PATENT DOCUMENTS

| 6,985,112 B2 | 1/2006 | Sadamori et al. |
| 2005/0258243 A1* | 11/2005 | Hsieh ............................ 235/441 |
| 2009/0294534 A1 | 12/2009 | Pepori et al. |
| 2010/0258639 A1* | 10/2010 | Florek et al. .................. 235/492 |

FOREIGN PATENT DOCUMENTS

| EP | 1 613 134 | 1/2006 |
| GB | 2 351 606 A | 1/2001 |
| JP | 4-271188 | 9/1992 |
| JP | 2000-331932 A | 11/2000 |
| JP | 2001-175828 A | 6/2001 |
| JP | 2007-208294 | 8/2007 |
| WO | WO 2009/011400 A1 | 1/2009 |

* cited by examiner

*Primary Examiner* — Karl D Frech
(74) *Attorney, Agent, or Firm* — Haynes and Boone, LLP

(57) ABSTRACT

The present disclosure relates to a circuit board including a supporting material and having conductive tracks on a top surface, wherein the circuit board has a recess in the supporting material, which opens into a lateral surface adjoining the top surface and into which an RFID microchip is inserted.

15 Claims, 1 Drawing Sheet

CIRCUIT BOARD WITH INTEGRATED RFID MICROCHIP

RELATED APPLICATIONS

This application claims priority to German utility model no. 20 2010 014 862.6, filed on Oct. 28, 2010, the contents of which are hereby incorporated by reference in its entirety.

SUMMARY

A circuit board according to embodiments disclosed herein may include a supporting material having conductive tracks on a top surface; a recess in the supporting material, the recess formed in a lateral surface adjoining the top surface; and an RFID microchip placed inside the recess.

DETAILED DESCRIPTION

Figure 1:
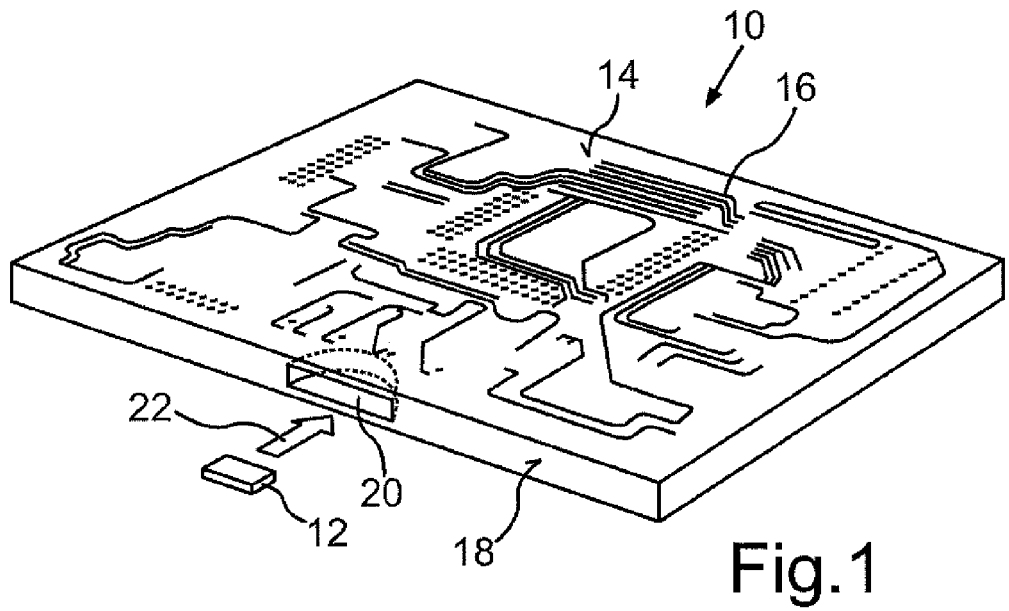
FIG. 1 schematically illustrates a circuit board and an RFID microchip before insertion thereof into the circuit board in perspective view.

The present disclosure addresses the question of how a circuit board can be coupled to an RFID microchip.

A circuit board is also referred to as a circuit card, board or printed circuit, and it is a support for electronic components. A circuit board includes an electrically insulating supporting material. Conductive connections, so-called conductive tracks, adhere thereto. The conductive tracks are mostly etched from a thin layer of copper.

The abbreviation "RFID" stands for "radio-frequency identification", thus it is a matter of the identification using high-frequency (electromagnetic) waves. A so-called RFID transponder is attached to an object to be tagged or identified. It includes an identifier. With the aid of a reading device, this identifier can be read out.

The RFID transponder usually includes a microchip on a support or in a housing, wherein the identifier is stored in the microchip and the microchip is coupled to an antenna.

The RFID technology also functions if an RFID microchip is coupled to the object to be identified. In this case, the electromagnetic radiation is capacitively coupled into the microchip such that the verification is performed from a relatively short distance, such as approximately 3 mm.

If one wishes to identify circuit boards, thus, the use of an RFID microchip is useful. For this purpose, the RFID microchip may be coupled to the circuit board in any manner.

Heretofore, one has simply applied the RFID transponders or RFID microchips to the circuit board (e.g. by adhering or soldering). Placing an RFID microchip on the circuit board is taken into account in the design of the conductive track layout, because sufficient space should be available for the RFID microchip.

In order to avoid that the RFID microchip projects too far up and above the circuit board, already heretofore, portions of the circuit board supporting material may be ablated by milling and formed a type of recess into which the RFID microchip could be inserted. This recess is formed on the top surface having the conductive tracks.

In addition, it is known to integrate an RFID microchip in the supporting material. Herein, the circuit board is constructed in laminar, thus in layered manner, and the RFID microchip is disposed in one layer. Thus, the RFID microchip identifier is known prior to forming the circuit board. However, the manufacturer of the support from the supporting material is not always the same company or person that later applies the conductive track and then has the need to provide an identifier.

Thus, embodiments consistent with the present disclosure demonstrate an improved coupling of an RFID microchip to a circuit board.

A circuit board having the features according to the present disclosure provides a simple and compact solution to placing an RFID microchip in a circuit board. Advantageous developments are mentioned in the description of the figures.

The circuit board according to embodiments in the present disclosure includes a supporting material, wherein the circuit board has conductive tracks on a top surface and optionally on a bottom surface. The supporting material includes a recess, which opens into a lateral surface adjoining the top surface and into which an RFID microchip is inserted.

Thus, the RFID microchip is inserted into the circuit board from the side according to some embodiments. Therefore, the recess can be provided after the circuit is formed on the supporting material without having influence on the conductive track, e.g. simply be milled into the circuit board supporting material. Thus, according to some embodiments the circuit board can be completely manufactured first, without having to consider an RFID microchip. The actual circuit board from the supporting material can be manufactured without having to insert an RFID microchip. Thus, according to embodiments consistent with the present disclosure the conductive tracks can be designed without having to consider a later joining RFID microchip. Rather, the RFID microchip can be provided on a finished circuit board at any time afterwards, according to some embodiments.

In some embodiments the recess opens towards a lateral surface. Therefore, a slot does not have to be provided at a corner of the circuit board. The smaller the opening of the recess is the more stable the circuit board remains. In some embodiments, the size of the recess is such that the RFID microchip can be inserted into the recess. Here, the "opening" is presently related to the shape of the recess as such in the supporting material.

However, irrespectively of the form of the supporting material, some embodiments may provide a filler material different from the supporting material in the recess. Thus, the shape of the recess opens a gap in the supporting material, and the recess as such is filled and closed towards the border, according to some embodiments. In particular, epoxy resin is suitable as the filler material, wherein the same epoxy resin in the supporting material or another one can be used as such an epoxy resin. In some embodiments, the supporting material includes FR4 material. FR4 material is glass fiber mats impregnated with epoxy resin.

According to some embodiments consistent with the present disclosure, the recess is a result of milling into the side with which the lateral surface is associated, namely laterally into the supporting material. For example, in milling with a circular disk, the recess will have a curved wall. The shape of the recess is not limiting of embodiments consistent with the present disclosure, as long as the RFID microchip fits in it. In some embodiments, the recess can be the result of laser processing (directing a laser beam into the side of the supporting material).

Below, embodiments consistent with the present disclosure are described in more detail with reference to the drawings.

Figure 2:
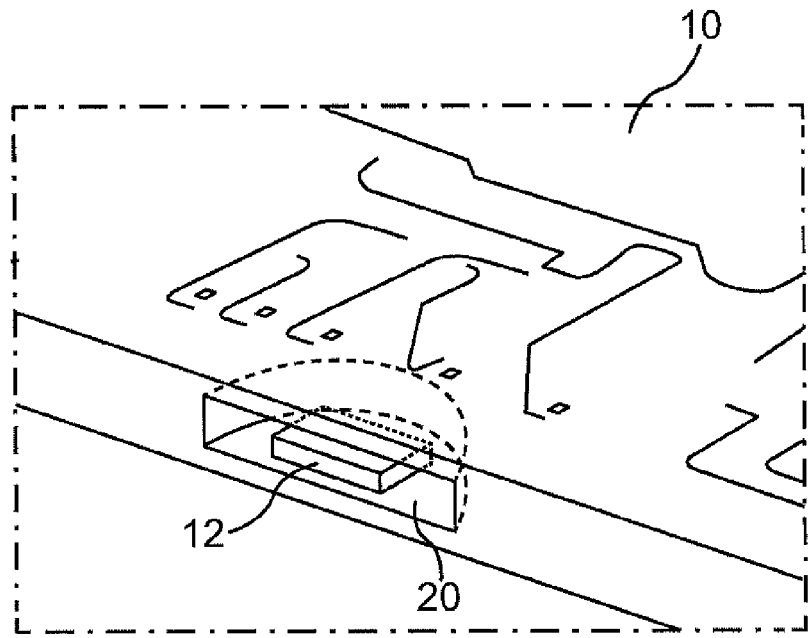
FIG. 2 shows the circuit board of FIG. 1 in enlarged perspective partial view, with an integrated RFID microchip.

FIG. 1 schematically illustrates a circuit board 10 and an RFID microchip 12 before insertion thereof into the circuit board 10 in perspective view. FIG. 2 shows circuit board 10 in enlarged perspective partial view, with integrated RFID microchip 12.

A circuit board denoted by 10 as a whole is provided with RFID microchip 12. Circuit board 10 supports conductive tracks 16 on its top surface 14, optionally also on the opposite surface (the bottom). Conductive tracks 16 are not to be impaired by providing RFID microchip 12, according to some embodiments. Conductive tracks 16 are presumed as already present. In some embodiments a recess 20 is formed on a lateral surface 18 adjoining the top surface 14, for example by milling with the aid of a circular milling disk. When a circular milling disk is directed substantially parallel to the top surface 14 of the circuit board 10, then, the recess 20 only opens into the lateral surface 18 or is accessible from it. Thus, according to embodiments consistent with the present disclosure recess 20 has the shape of a slot in lateral surface 18. Thus, RFID microchip 12 can be placed in recess 20 according to the direction pointed by arrow 22, once recess 27 has a suitable size. In embodiments where the body of the circuit board 10 is composed of a supporting material such as for example FR4 material (glass fiber mats impregnated with epoxy resin), recess 20 can be filled with epoxy resin, in case of FR4 material with the same epoxy resin. First, the epoxy resin is liquid and fills the recess 20. Thereafter, it is solidified. Thus, one obtains the assembly shown in FIG. 2.

Circuit board 10 can be manually provided with the integrated microchip 12 by one having skills to master milling procedures and devices.

Circuit board 10 is identifiable with the aid of the RFID microchip 12. An identifier is stored on the RFID microchip. According to RFID type, subsequent programming of the microchip by the user is also possible.

Electromagnetic radiation can be capacitively coupled into the RFID microchip over a distance of 3 mm such that the identifier contained in the RFID microchip can be read out, or written. In some embodiments, it may be desirable to read out or write from greater distances and an antenna for coupling in by radio may be provided. For example, in some embodiments an RFID transponder with antenna and chip on a suitable support can immediately be inserted into recess 20. In some embodiments, RFID microchip 12 is inserted into recess 20 and an antenna is attached to top surface 14 of circuit board 10. The antenna is then coupled to RFID microchip 12. According to some embodiments, adaptation of the extension of the conductive tracks 16 on the top surface 14 of the circuit board 10 can be effected.

Embodiments described herein are illustrative only and not limiting. One of regular skill in the art may find variations of the embodiments disclosed herein consistent with this disclosure. As such, this disclosure is only limited by the following claims.

The invention claimed is:

1. A circuit board comprising:
   a supporting circuit board material having conductive tracks on a top surface;
   a recess in the supporting circuit board material, the recess formed in a lateral surface adjoining the top surface; and
   a radio frequency identification (RFID) microchip placed inside the recess.

2. The circuit board according to claim 1, wherein the recess opens towards a lateral surface.

3. The circuit board according to claim 1, wherein the recess is filled with a filler material different from the supporting circuit board material after the RFID microchip is placed inside the recess.

4. The circuit board according to claim 3 wherein the filler material includes epoxy resin.

5. The circuit board according to claim 1, wherein the supporting circuit board material comprises FR4 material.

6. The circuit board according to claim 1, further comprising an RFID transponder placed with the RFID microchip into the recess.

7. The circuit board according to claim 1, wherein the recess is formed by a milling process or a laser process into the side of the lateral surface of the supporting circuit board material.

8. The circuit board according to claim 1, wherein the supporting circuit board material has conductive tracks on a bottom surface.

9. The circuit board according to claim 1, wherein the RFID microchip is positioned in the recess so that no electrical contacts are formed between the RFID microchip and the circuit board.

10. The circuit board according to claim 1, wherein the recess does not conform to a shape of the RFID microchip.

11. A method for manufacturing a circuit board, the method comprising:
    forming a recess in a lateral surface of a circuit board, the circuit board including a supporting circuit board material having conductive tracks on a top surface, the lateral surface adjoining the top surface, wherein the forming process comprises milling or laser processing the recess into the lateral surface of the supporting circuit board material; and
    inserting a radio frequency identification (RFID) microchip into the recess.

12. The method of claim 11, wherein the supporting circuit board material comprises FR4 material.

13. The method of claim 11, wherein an RFID transponder is placed with the RFID microchip into the recess.

14. The method of claim 11, further comprising filling the recess with a filling material which is different from the supporting circuit board material.

15. The method of claim 14, wherein the filler material includes epoxy resin.

* * * * *